United States Patent [19]
Antell

[11] Patent Number: 4,625,226
[45] Date of Patent: Nov. 25, 1986

[54] PHOTODETECTOR

[75] Inventor: George R. Antell, Saffron Walden, England

[73] Assignee: Standard Telephones and Cables Public Limited Company, London, England

[21] Appl. No.: 641,694

[22] Filed: Aug. 17, 1984

[30] Foreign Application Priority Data

Aug. 18, 1983 [GB] United Kingdom ............... 8322235

[51] Int. Cl.[4] ..................... H01L 27/14; H01L 31/00
[52] U.S. Cl. ......................................... 357/30; 357/16; 357/56
[58] Field of Search ................. 357/30, 16, 52, 56, 357/61, 91

[56] References Cited

U.S. PATENT DOCUMENTS 4,442,444  4/1984  Osaka ............................... 357/30

FOREIGN PATENT DOCUMENTS 0072084  5/1980  Japan ............................... 357/30
1549040  7/1979  United Kingdom .
2029639  3/1980  United Kingdom .

Primary Examiner—James W. Davie
Assistant Examiner—Georgia Y. Epps
Attorney, Agent, or Firm—Kerkam, Stowell, Kondracki & Clarke

[57] ABSTRACT

A structure of photodetector in which the active region is formed by creating a p-n junction (6) extending in a layer (3) of material of small band gap (InGaAs) in such a way that it emerges in material (InP) of a larger band gap (2) at the surface of the semiconductive body.

16 Claims, 14 Drawing Figures

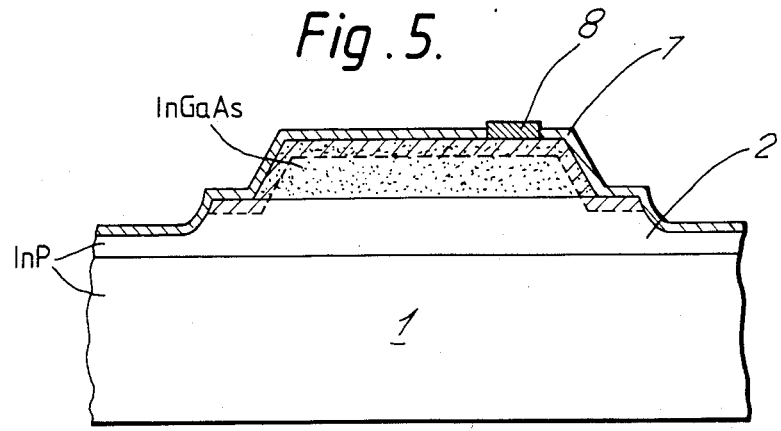
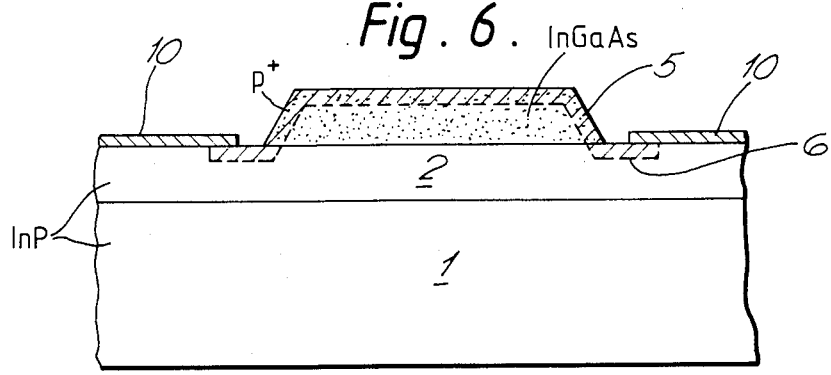
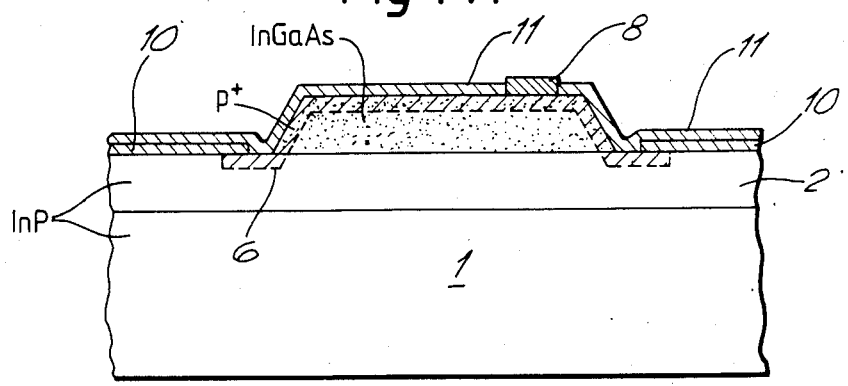

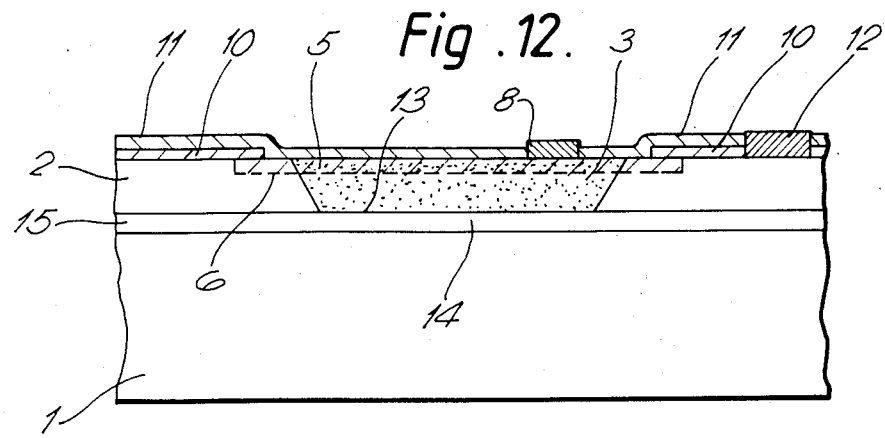
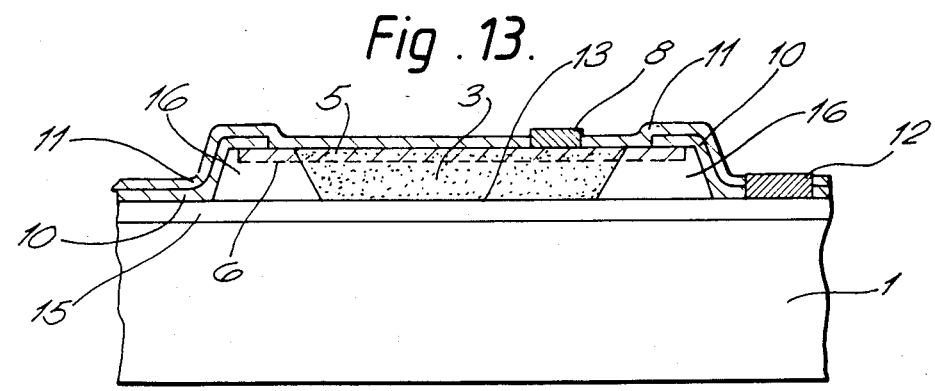
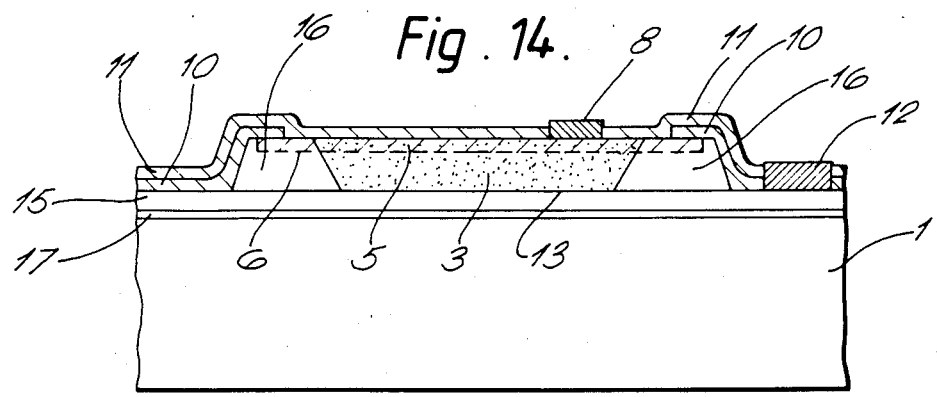

PHOTODETECTOR

BACKGROUND OF THE INVENTION

This invention relates to constructions of photodetectors, and in particular to those that are sensitive to wavelengths out to 1.6 microns or beyond and are constructed to produce a photocurrent from the absorption of light in $In_{1-x}Ga_xAs_yP_{1-y}$, where $0.9 \leq y \leq 1$ (i.e. material having a band gap of not more than 0.8 eV).

In moving from GaAs photodetectors through to photodetectors fabricated in smaller band gap material, which are sensitive deeper into the infra-red, the problems of dark current become much more significant. Thus for instance, a photodetector fabricated in n-type GaAs (1.42 eV) by opening a 150 micron diameter window in a silica masking/passivation layer for a zinc diffusion typically provides a device with a dark current of a few tens of picoamps when reverse biassed at 5 volts. In a series of comparative tests, similar structures constructed in InP (1.35 eV) instead of GaAs were found to exhibit a dark current typically of a few nanoamps, structures constructed in InGaAsP (lattice matched with InP) having a band gap of 1.13 eV exhibited dark currents typically of a few tens of nanoamps, but structures constructed in InGaAs (0.75 eV) (also lattice matched with InP) did not show any rectifying characteristics.

The unsatisfactory characteristics of the low bandgap material appear to result from surface effects where the p—n junction is covered by the silica masking/passivation layer. Manufacture of InGaAs photodetectors using silicon nitride instead of silica has been reported. However, the technology required to implement silicon nitride passivation entails certain difficulties not encountered when using silica passivation, and for this reason it is desirable to avoid having to have recourse to silicon nitride technology if at all possible.

British Patent Specification No. 2029639A, to which attention is directed, refers to the problems of leakage current in a photodetector at the boundary of its p—n junction, and discloses how these problems may be reduced or effectively eliminated by an overlay of higher band gap material through which the diffusion is made so that the p—n junction comes to the surface of the semiconductor body in the higher band gap material. Such structures can be made using vapour phase epitaxy to form the overlay, but with liquid phase epitaxy the equilibrium conditions result in severe melt-back problems when attempting for instance to grow a layer of InP upon a layer of InGaAs, and this gives an unsatisfactory interface associated with a disturbed region of growth. This melt-back problem is not confined exclusively to growth on InGaAs, but applies also to growth on InGaAsP having a low phosphorus content, and is for instance still significant when attempting to use liquid phase epitaxy to grow InP on quaternary material having a band gap of 0.85 eV.

SUMMARY OF THE INVENTION

The present invention is concerned with a photodetector construction suitable for detecting light out to about 1.6 to 1.68 microns that can satisfactorily be implemented without recourse either to silicon nitride passivation technology or to vapour phase epitaxy.

According to the present invention there is provided a photodetector whose active region is provided in the vicinity of a p—n junction in an $In_{(1-x)}Ga_xAs_yP_{(1-y)}$ body in a region where that junction extends in a first zone of material for which $0.9 \leq y \leq 1$, which junction emerges at the surface of that body in a second zone which is of higher band gap than that of the first and upon which the first zone is directly or indirectly epitaxially grown upon the second.

The invention also resides in a method of making a photodetector whose active region is provided in the vicinity of a p—n junction in an $In_{(1-x)}Ga_xAs_yP_{(1-y)}$ body in a region where that junction extends in a first zone of material for which $0.9 \leq y \leq 1$ wherein the first zone is epitaxially grown directly or indirectly upon a second zone of higher band gap material than that of the first and wherein the p—n junction is created in the body by diffusion or implantation of a conductivity type determining dopant in such a manner that in the completed device the junction emerges at the surface of the body in the material of the second zone.

BRIEF DESCRIPTION OF THE DRAWINGS

There follows a description of the manufacture of $In_{(1-x)}Ga_xAs_yP_{(1-y)}$/InP photodetectors embodying the invention in preferred forms. The description refers to the accompanying drawings in which:

FIGS. 1 to 5 depict successive stages in the manufacture of a first structure of photodetector, FIGS. 6 and 7 depict the later stages of the manufacture of a second structure of photodetector.

FIGS. 12 to 14 depict respectively fourth, fifth and sixth structures of photodetector that are variants of the structure of FIGS. 8 to 11.

DETAILED DESCRIPTION OF PREFERRED EMBODIMENTS

Figure 1:
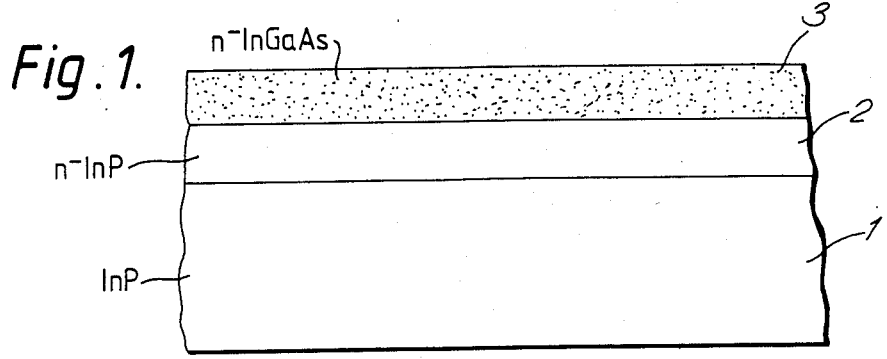

An InP substrate 1 is provided upon which is grown an $n^-$ type layer 2 of InP and then an $n^-$ type layer 3 of InGaAs (FIG. 1). The epitaxially grown layers 2 and 3 are made of $n^-$ type material to provide low junction capacitance in the completed device. Typically, the substrate 1 is made of $n^+$ type material, in which case it is convenient to provide the counter electrode (not shown) of the completed device on the underside of this substrate.

Figure 2:
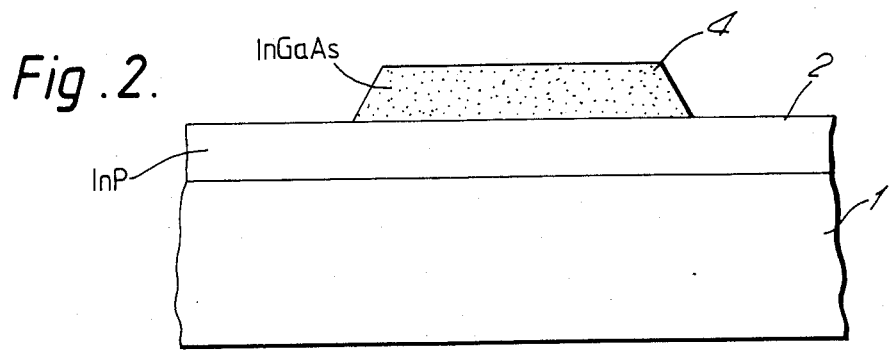
Figure 3:
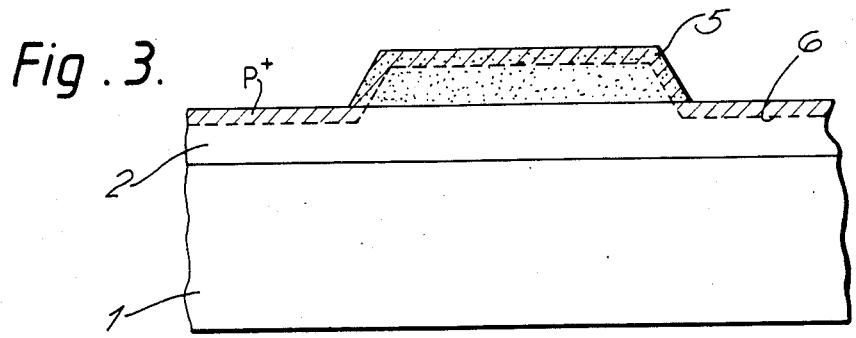

Next standard photolithographic masking and selective etching are used to etch away the InGaAs layer to leave a mesa 4 of InGaAs protruding from a surface of InP (FIG. 2). This is followed by diffusion with a p-type dopant such as zinc or cadmium to produce a $p^+$ type surface layer 5 (FIG. 3).

Figure 4:
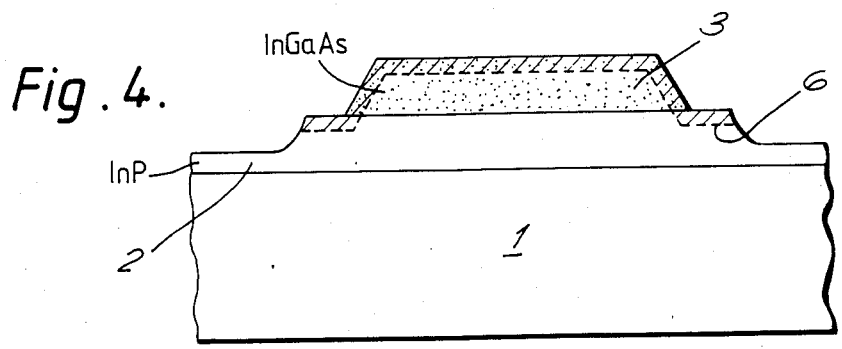

This is followed by a second photolithographic masking and etching to remove the $p^+$ type material from the outlying regions and thereby modify the original shape of the mesa to produce a stepped mesa that contains all the $p^+$ type material. This means that the p—n junction 6 formed between the $p^+$ type material and the $n^-$ type emerges at the surface of the semiconductive material in the sides of the mesa in InP (FIG. 4).

Thus, the p—n junction 6 extends through two zones, a first zone comprising the $n^-$ InGaAs layer 3, and a second zone comprising the $n^-$ InP layer 2. The second zone, which has the surface at which the p—n junction 6 emerges, has a higher band gap than the first zone.

For $p^+$ InGaAs the contact can be of either alloyed or Schottky form, for instance titanium with an overlay of gold. The exposed semiconductive surface is covered with a silica passivation layer 7 deposited using conventional passivation technology, and then a window is opened in this passivation for the contact 8 (FIG. 5).

More specifically a set of such devices were produced by first growing by liquid phase epitaxy a buffer layer 2 of n-type InP($10^{16}$cm$^{-3}$) followed by an n-type layer 3 of InGaAs ($2-5\times 10^{15}$cm$^{-3}$), both about 3 microns thick. The substrate 1 was sulphur doped, (100) oriented InP. InGaAs mesas 4 of area 200 microns $\times$400 microns were formed on the InP buffer layer 2 by selective etching using 1:1:8 $H_2SO_4:H_2O:H_2O_2$. An SiO$_2$ film 10, 270nm thick, was deposited on both the mesas and the surrounding InP surface by the plasma assisted reaction of SiH$_4$ with N$_2$O at 400° C. Using negative photoresist windows larger than the mesas were opened in the SiO$_2$ film with the mesas located symmetrically in the windows. For the initial devices the width of the band of exposed InP surrounding the mesa was 20 microns, but this could be reduced considerably.

The slice was diffused in a sealed silica ampoule at 540° C. for 30 minutes using ZnAs$_2$ as the diffusant source. A continuous pn junction 6 was thus formed in the InGaAs mesa and in the surrounding 20 microns wide band of InP with the junction emerging in planar fashion at the InP surface under the edge of the SiO$_2$ window.

After diffusion a further film 11 of SiO$_2$ was deposited which both passivated the device and acted as an anti-reflection layer. Contact windows were opened on top of the mesas using positive resist in this case and contacts of Ti-Au and Au-Ge-Ni were formed on the mesas and substrate respectively.

According to an alternative process, the creation of the mesa structure as depicted in FIG. 2 is followed by performing the p-type diffusion through a diffusion mask 10 (FIG. 6) of silica. This limits the extent of the p$^+$ type layer 5 to the surface of the mesa 4 and the region immediately surrounding it.

In this instance the effect of lateral diffusion under the mask 10 is to produce a structure in which the p−n junction emerges at the surface of the semiconductive body in a region that is already protected by the diffusion mask. The contact with the p$^+$ material may be made as depicted in FIG. 7 in which a further silica layer 11 is deposited over the whole surface, and then the contact 8 is formed in a window formed in this layer 11. This leaves a silica layer covering the whole surface. If, for some reasons this is not desired, a Schottky contact can be made without the use of a mask or an alloyed contact can be made using lift-off masking techniques.

The devices described with reference to FIGS. 1 to 7 have been essentially mesa type devices, but for some applications a more nearly planar structure may be preferred.

Figure 8:
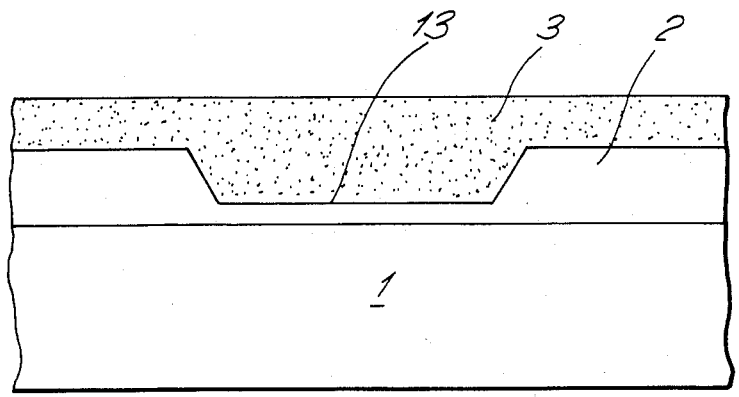
FIGS. 8 to 11 depict successive stages in the manufacture of a third structure of photodetector.
Figure 9:
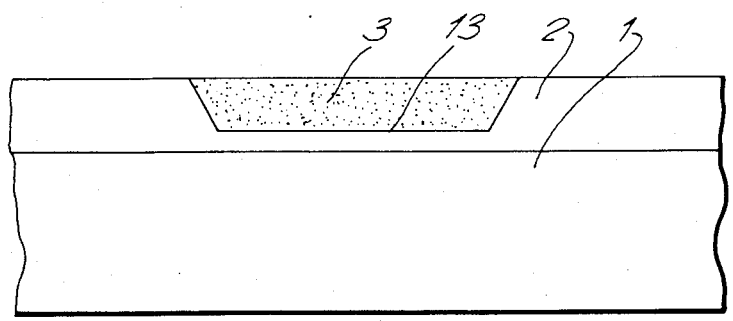

Such a structure may be constructed by etching a well in the material of InP layer 2 prior to the growth of the InGaAs layer 3. Such a well is depicted at 13 in FIG. 8. The freshly grown material is then etched to remove all the InGaAs, except that lying in the well, so as to leave an approximately planar surface as depicted in FIG. 9. (FIG. 9 shows the upper surface of the InGaAs as being exactly flush with that of InP, however differences in etch characteristics may leave it at a slightly different height, either standing slightly proud of the InP or slightly recessed with respect to it.)

Figure 10:
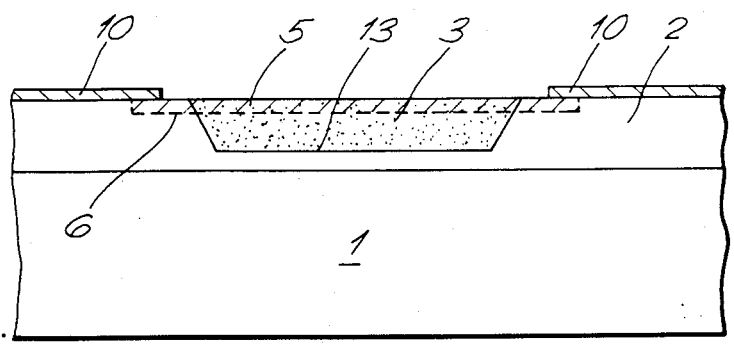

The etching is followed by performing a p-type diffusion through a diffusion mask 10 (FIG. 10) of silica to limit the extent of the p$^+$ type layer 5 to the surface of the InGaAs in the well and the region immediately surrounding that well.

Figure 11:
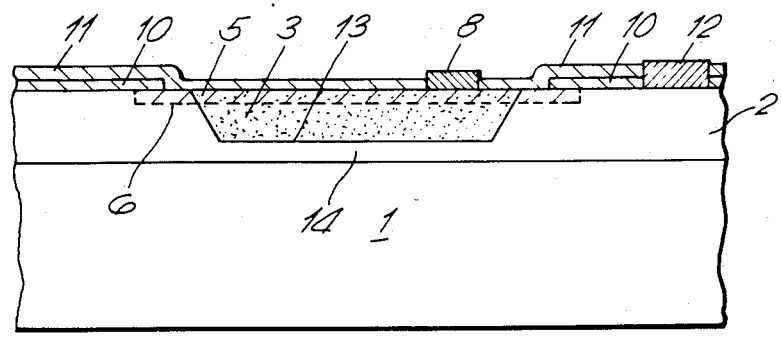

Once again, the effect of lateral diffusion under the mask 10 is to produce a structure in which the p−n junction emerges at the surface of the semiconductor body in a region that is already protected by the diffusion mask. Contacts with the p$^+$ and the n$^-$ material may be made as depicted in FIG. 11 in which a further silica layer 11 is deposited over the whole surface, and then the contacts 8 and 12 are created in windows formed in this layer 11. Also, as before, if for some reason the silica passivation layer 11 covering the whole surface of the detector is not required, a Schottky contact can be made with the p$^+$ InGaAs without the use of a mask, or an alloyed contact can be made using lift-off masking techniques.

It may be noted that in the structure of FIG. 11 most of the photocurrent has to pass through the region 14 between the bottom of the well and the top of the substrate 1. This can produce problems of excessive resistance if the substrate 1 is constructed in semi-insulating material and region 13 is thin. Such difficulties can however be avoided by adopting the structure depicted in FIG. 12. Here an n$^+$ layer 15 of In$_{(1-x)}$Ga$_x$As$_y$P$_{(1-y)}$, where y typically lies between 0.3 and 0.6, is grown upon the semi-insulating InP. Layer 15 contains sufficient phosphorus to enable satisfactory growth of the succeeding layer 2 by liquid phase epitaxy. This layer serves two functions in that first it provides an etch stop for a selective etch, such as HCl+H$_3$PO$_4$, when etching the well 13, and second it provides a relatively higher conductivity path in the region 14 under the well.

If the region of the n$^-$ material of layer 2 lying between the contact 12 and the n$^+$ provides an inconveniently high resistance path, this problem can be avoided by arranging for the contact to be formed directly upon the n$^+$ layer. To this end, immediately prior to the deposition of the diffusion masking layer 10, the material of layer 2 is etched away to leave only an annular region immediately surrounding the well. Then processing proceeds as before to result in the structure of FIG. 13. With this structure there is no current flow through the annulus 16 of material remaining from layer 2, and hence this layer may be made of high resistivity InP rather than of n$^-$ type material.

A small penalty of this approach is that a mesa type structure again results. However, if this penalty can be accepted, it also opens the possibility for forming the photodetector as part of a monolithic structure. For this purpose an additional n-type layer 17 (FIG. 14) is grown on the substrate 1 prior to the growth of layer 15. Later, in a region to one side of the annulus 16 and the photodetector contacts, layers 2 and 15 are removed by selective etching to expose a structure, comprising an n-type InP layer upon a semi-insulating InP substrate, in which FET's can be created. In this instance an HCl+H$_3$PO$_4$ etch may be used for the selective removal of layer 2 and then a H$_2$SO$_4$+H$_2$O$_2$ etch for the selective removal of layer 15. FET's can then be made in a conventional fashion in layer 17.

Although the foregoing description has referred exclusively to structures formed by diffusion of a p-type dopant into n-type material, it should be understood that the complementary structure is also possible that involves the diffusion of an n-type dopant into p-type material. It will also be evident that an alternative way of achieving the required change in conductivity type is by ion implantation.

I claim:

1. In a photodetector;
   an $In_{(1-x)}Ga_xAs_yP_{(1-y)}$ body;
   an active region provided in the vicinity of a p—n junction in the body; and
   the junction extending in a first zone of material for which $0.9 \leq y \leq 1$, and the junction emerging at a surface of the body in a second zone which is of higher band gap than that of the first zone and upon which the first zone is directly or indirectly epitaxially grown.

2. A structure as claimed in claim 1, wherein the p—n junction emerges at the surface of the semiconductive body in a region covered with a passivation layer.

3. A structure as claimed in claim 2, wherein the passivation layer is a layer of silica.

4. A structure as claimed in claim 1, wherein the material of the first zone is grown by liquid phase epitaxy upon the material of the second zone.

5. A structure as claimed in claim 4, wherein the p—n junction emerges at the surface of the semiconductive body in a region covered with a silica passivation layer.

6. A structure as claimed in claim 1, wherein the active region forms part or all of a mesa.

7. A structure as claimed in claim 6, wherein the p—n junction emerges at the surface of the semiconductive body on the sides of the mesa.

8. A structure as claimed in claim 6, wherein the p—n junction emerges at the surface of the semiconductive body in a ring surrounding the base of the mesa.

9. A structure as claimed in claim 6, wherein the p—n junction emerges at the surface of the semiconductive body in a region covered with a silica passivation layer.

10. A structure as claimed in claim 1, wherein the first zone at least partially fills a well in the surface of material constituting the material of the second zone.

11. A structure as claimed in claim 10, wherein the p—n junction emerges at the surface of the semiconductive body in a region covered with a silica passivation layer.

12. A structure as claimed in claim 1, wherein the first zone at least partially fills an aperture through a layer of material constituting the material of the second zone.

13. A structure as claimed in claim 12, wherein the p—n junction emerges at the surface of the semiconductive body in a region covered with a silica passivation layer.

14. A structure as claimed in claim 13, wherein the material of the second zone is in the form of an annulus surrounding the material of the first zone.

15. A structure as claimed in claim 1, wherein the material of the first zone is InGaAs, which is grown by liquid phase epitaxy upon the material of the second zone and wherein the p—n junction emerges at the surface of the semiconductive body in a region covered with a silica passivation layer.

16. A structure as claimed in claim 15, wherein the material of the second zone is InP.

* * * * *